United States Patent [19]

Webber

[11] Patent Number: 5,309,499
[45] Date of Patent: May 3, 1994

[54] COMMUNICATIONS LINE TESTING

[75] Inventor: Alan Webber, Bath, England

[73] Assignee: British Telecommunications Public Limited Company, London, Great Britain

[21] Appl. No.: 855,001

[22] PCT Filed: Nov. 8, 1990

[86] PCT No.: PCT/GB90/01718
§ 371 Date: May 1, 1992
§ 102(e) Date: May 1, 1992

[87] PCT Pub. No.: WO91/07834
PCT Pub. Date: May 30, 1991

[30] Foreign Application Priority Data

Nov. 8, 1989 [GB] United Kingdom ............... 8925205

[51] Int. Cl.$^5$ ............................................. H04M 3/30
[52] U.S. Cl. ............................................. 379/29
[58] Field of Search .................... 379/21, 22, 24, 25, 379/27, 29

[56] References Cited

U.S. PATENT DOCUMENTS 4,629,835 12/1986 Miller .................................... 379/26

FOREIGN PATENT DOCUMENTS 1394670 5/1975 United Kingdom .
2071341 9/1981 United Kingdom .

OTHER PUBLICATIONS

British Telecommunications Engineering, vol. 2, No. 4, 1984, (London, GB) D. V. Thorpe: "Processor-controlled systems for the testing of customers' lines", pp. 261–266.

Primary Examiner—Stephen Chin
Assistant Examiner—Paul Loomis
Attorney, Agent, or Firm—Nixon & Vanderhye

[57] ABSTRACT

A tester for a communications (e.g. telephone) line pair comprising a pair of different valued resistors (R1 and R2) each connected in series with a diode (D1 and D2). The diode/resistor pairs are connected in parallel between connectors (A and B) such that one of the pair provides a path for a DC voltage of one polarity and the other of the pairs provides a path for a DC voltage of the other polarity. The device is connected to the ends of a spare pair of telephone wires at a remote distribution point. The spare pair is provided with it's exchange equipment termination and testing is carried out at the local exchange via the test access facility to check that the pair of wires is in working condition before sending installers out in site. The test procedure includes measuring the total resistance of the lines to determine whether the difference in resistance readings as determined are in accordance with the difference between the resistances (R1 and R2) in the device itself. If so, the lines are in working condition. If not, there is a fault and the lines cannot be used.

20 Claims, 1 Drawing Sheet

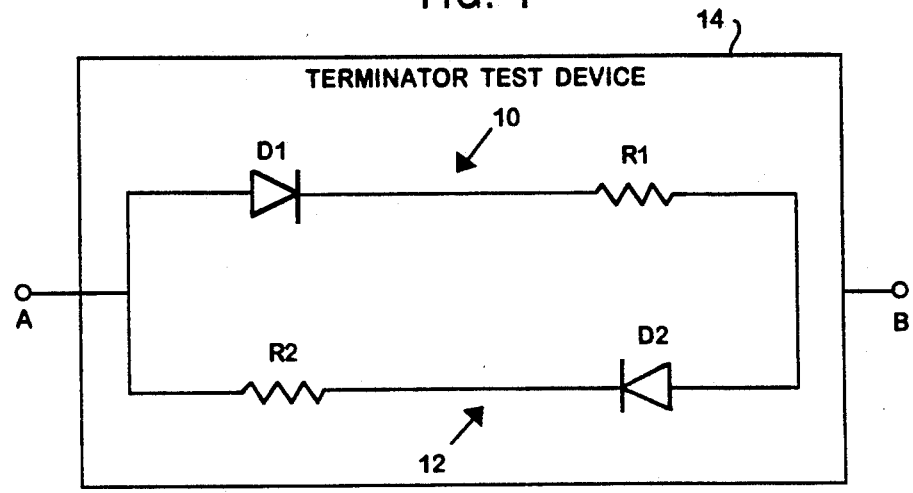
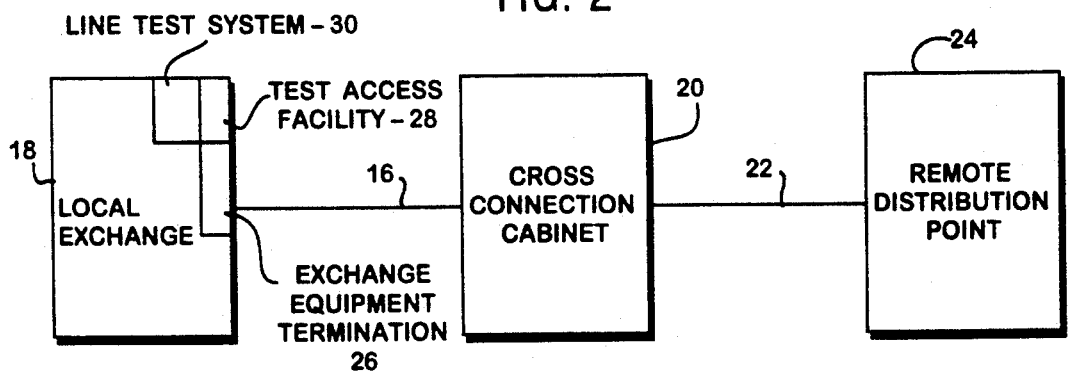
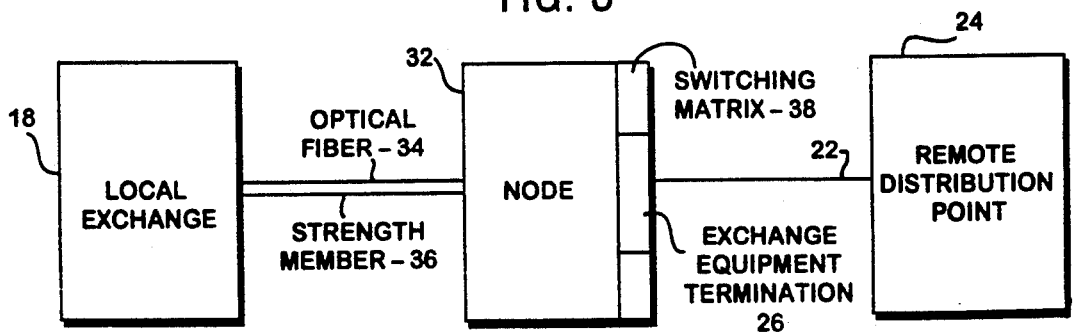

COMMUNICATIONS LINE TESTING

This invention relates to the testing of the working condition of a spare line pair of a communications cable using a device connected between remote ends of the line pair.

Communications lines, such as telephone cables, are most commonly deployed with an over-capacity in the number of pairs of wires. The cable runs to a distribution point where the various wire pairs are mounted ready for connection to customer telephones and other telecommunication apparatus. The over-capacity is provided to accommodate new customers requiring connection, and is called "spare pairs" or "spare line pairs".

Before a previously redundant (i.e. spare) pair of wires constituting a telephone line can be used to connect a customer, it is necessary to test the wires to ensure they are both in working condition.

To test the pairs before they are put to use, it is presently necesary to send an installation technician to conduct appropriate tests on the nominated wires at the distribution point local to a particular customer. In the event that a pair of wires corresponding to a particular designated telephone number are defective, a technician cannot connect the customer and he must return to the central exchange and have a further pair of wires designated for that customer's use. Once this is done, the technician must again visit the site and conduct the tests. It is clear that nominating a defective wire pair can lead to at least one wasted site visit before the fact is detected.

It is clearly desirable to be able to test a given line pair remotely before the installer conducts the time consuming and expensive site visit.

Line test systems are known which are able to diagnose various line faults, and line characteristics from a remote location. An example of such a proprietary line test system is the 4TEL system made by Teradyne Limited of Western Centre, Western Road, Bracknell, Berkshire, RG12 1RW, England.

These systems use sophisticated software test routines and test signals which exploit the inherent capacitance and resistance in a line pair to determine the nature and location of a fault and/or the parametric data associated with the line, for example, susceptance, resistance, leakance etc. These systems can also be used to determine the length of a line pair. However, they are not accurate enough to be able to determine whether an unterminated pair is in good working condition or whether there is a break in either wire in the vicinity of the distribution point. This latter condition would result in an indication of a pair of unterminated wires apparently in good condition.

It is an object of the present invention to provide a method of testing the working condition of a spare line pair of a communications cable from a remote location, a test device for use in such a method, and a communications system arranged for such testing.

According to the present invention there is provided a method of testing the working condition of a spare line pair of an electrically conductive communications cable which extends from a node to a remote distribution point, from which distribution point the remote end of each working line pair of the cable is connected to a customer's premises or to a further distribution point, as appropriate, and a similar connection is intended for the or each spare line pair of the cable;

the method of including the prior steps of identifying at least one spare line pair of the cable; connecting an individual spare line test device between the ends of the or at least one spare line pair at the remote distribution point, the test device having a first signal conditioning characteristic to a signal of one polarity applied to the line and a second signal conditioning characteristic to a signal of the other polarity applied to the line; and leaving the or each test device connected to its associated line pair while that line pair remains spare;

providing at the node an exchange equipment termination for the or said at least one spare line pair;

and the method including the further steps of applying signals of both polarities to a spare line pair via a test access facility associated with the exchange equipment termination for that spare line pair; and determining from the relative conditions of the signals whether the tested spare line pair is in working order.

Preferably, the signals are those of the proprietary line test system used and could be DC or DC superimposed on an AC signal applied with opposite polarity across the line.

The invention also extends to a test device for use in the above method, the device including means for connecting the device between the end of a line pair to be tested, first signal conditioning means which pass signals of the one polarity applied across the connecting means, second signal conditioning means which pass signals of the other polarity applied across the connecting means, and characterised by a housing containing one only said first signal conditioning means and one only said second signal conditioning means.

Preferably, the first and second signal conditioning means are connected in parallel between the connecting means.

Preferably, the first and second signal conditioning means are passive, for example electrical impedances.

According to the present invention there is further provided a communications system having the capability for testing the working condition of spare line pairs, the system comprising an electrically conductive communications cable which extends from a node to a remote distribution point and has a plurality of spare line pairs, a test access facility associated with exchange equipment terminations means for applying signals to the test access facility, and means for determining information on the tested line pair; and the system being characterised by a plurality of identical test devices connected between the ends of a respective plurality of spare line pairs at the remote distribution point by the other ends of the respective plurality of spare line pairs being terminated at the node in respective exchange equipment terminations; by the signal applying means being arranged to apply signals of both polarities via the test access facility to a selected one of the spare line pairs connected to a test device; and by the determining means being arranged to determine from the relative conditions of the signals whether the line pair under test is in working condition.

A test routine can be incorporated within the software of a known line test system. The test device is connected between a pair of wires at the distribution point. The signals are transmitted along the wires from the exchange and monitored in order to determine whether the condition of the signals is indicative of a pair of wires in working condition.

Thus, it is possible to check whether the wires are in working condition before dispatching the installer to the site (distribution point). Furthermore, provided the device is connected according to a prescribed convention, it is also possible to identify the individual wires of the pair based on the different conditioned signals.

In the case of optical fibre communication it may be necessary to rely on local conductive lines to connect up customers. Thus, an optical fibre will be terminated at a node from which the local lines will be distributed. This node may be the telephone exchange where the test signals are applied to the test access point or it may be a more local node in which case the lines will have their exchange equipment terminations at this local node and access to these terminations for testing will be via conductive wires in the optical fibre cable from the exchange to this local node.

The present invention can be put into practice in various ways one of which will now be described by way of example with reference to the accompanying drawings in which:

FIG. 1 is a circuit diagram of a test device in accordance with the invention;

FIG. 2 is a schematic diagram of one cable arrangement between an exchange and a remote distribution point; and FIG. 3 is a schematic diagram of an alternative arrangement to that of FIG. 2.

Referring to FIG. 1, a terminator test device comprises a first path 10 comprising a diode D1 serially connected to a 56 kohm resistor R1 and a second path 12 comprising a diode D2 serially connected to a 100 kohm resistor R2.

The two paths 10 and 12 are connected in parallel between connecting terminals A and B which in use are each respectively connected to a corresponding end of one of the wires of the line to be tested. These are referred to as the A and B legs.

The anode of the diode D1 is connected to terminal A and the anode of the diode D2 is connected to terminal B.

The components are disposed within a sealed housing 14 from which extend the two terminals A and B. The terminals are used to connect the device between the wires of a pair at the distribution point.

The housing 14 is a weatherproof rigid plastics moulding. For the sake of convenience, one outside face of the housing is provided with a surface suitable for writing on in pencil or some other erasable means. This may be used to note details of a particular line pair to which the device is connected, such as the corresponding telephone number.

Although not shown in the circuit diagram of FIG. 1, it is possible to protect the device from a potentially damaging overvoltage by connecting a discharge tube or similar device between the terminals A and B. A typical source of an overvoltage results from the accidental use of an insulating resistance meter producing potential differences in excess of 500 volts of random polarity. Without some form of overvoltage protection these may damage the circuit components.

In accordance with the present invention the device is for use with a quiescent (spare) telephone line. The likely potential differences are in the ranges $-48$ volts to $-58$ volts in leg B and 0 volts to $-5$ volts in leg A.

In this embodiment the resistors are 0.25 watt carbon resistors with a tolerance of $\pm 5\%$.

The housing 14 is conveniently made as small as possible. One practical version has dimensions of 80 mm $\times$ 15 mm $\times$ 10 mm. Any suitable screw or spring displacement connectors may be used at the terminals A and B moulded into the housing. These are colour coded in order that the device can be connected up between the line pair according to an established convention such that not only the working condition of the wires can be determined, but also which wire is which.

As an alternative, the device may be provided with colour coded fly leads, possibly having test clips for connection between the wires. In this case, it is necessary for the clips to be well insulated to prevent accidental electrical contact with surrounding surfaces or other wires. However, it may be more convenient to leave the fly leads bare so that an installer can fit clips of his preference.

The device is connected between the ends of a pair of redundant (spare) wires at a distribution point. It is left in place until such time as the pair is required for use, and the near end of the line pair is provided with an exchange equipment termination. At this time, and before the installation personnel have been sent out to connect up a customer, a centralised diagnostic test is performed using a line test system of the type previously described. The test signals are applied to the test access point of the local exchange, but the control position for the line test system need not be at the local exchange and can be at a centralised maintenance and testing facility (test centre).

Firstly, a first line test signal, i.e. a DC voltage of one polarity, is applied across the lines of the pair such that the diode D1, for example, conducts. The line test system will derive a reading for the total line resistance, including the 56 kohms of the resistor R1.

Secondly, a second line test signal, i.e. a DC voltage of the opposite polarity, is applied across the wires such that the other diode D2 conducts. The line test system will derive a reading for the new, different, total line resistance, including the 100 kohms of the resistor R2.

FIG. 2 shows schematically the arrangement when all of the local line from the local exchange is electrically conductive cable. A telephone cable 16 extends from a local exchange 18 to a cross-connection cabinet 20 from which a telephone cable 22 extends to a remote distribution point 24. Normal working line pairs are provided with exchange equipment terminations 26, as is known in the art, and the exchange has a test access facility 28, also as is known in the art, and a 4TEL line test system (LTS) 30. In a network of exchanges the control of the LTS 30 may be from a test centre (not shown) remote from exchange 28, to which the LTS 30 can report its test results via appropriate communications links.

In FIG. 3, the local exchange 18 is connected by an optical fibre cable 34 to a node 32 which extends to remote distribution point 24 by telephone cable 22. In this arrangement the working line pairs are provided with their exchange equipment terminations 26 at node 32, and signalling between the exchange 18 and the distribution point 24 is via the node 32 by means of the electrically conductive strength members 36 of the cable 34 and a switching matrix 38 at the node 32 for selecting the relevant exchange equipment termination.

It will be appreciated that if node 32 is sufficiently large then the test access facility and the line test system can be situated at the node 32, and the line test system will communicate with its test centre via the optical fibre link.

Having determined the two different total line resistances using the voltage of opposite polarity the line test system will display the relevant parametric data at the test centre. The line test system is arranged to display the parametric data created by the test device and thus indicate to a user by the values displayed whether a test device is fitted or not. The line test system may also be adapted to determine by means of a computer algorithm whether the difference in the line resistances is in accordance with that of the first and second paths of the device, and thereby to indicate whether a test device is fitted or not. In simple terms, this means that the line pair has been proved acceptable from the exchange to the remote distribution point so that a customer requesting telephone service by going off-hook will be recognised by the exchange equipment and sent dial tone.

As mentioned previously, by adhering to a convention as to which terminal of the test device is connected to which wire of the pair, i.e. the A terminal to the A leg and the B terminal to the B leg, it is also possible for the line test system to identify the wires of each pair from one another, based on the higher resistance of the path in one direction compared to that in the other.

Installers can hold stocks of the test device for connection between new pairs of wires at distribution points and for retro-fitting to existing pairs. When a pair of wires is brought into service the connected device can be retrieved for re-use if it is not damaged.

The use of the device and the test procedure according to the invention represents an initial expenditure in the devices themselves. However, this is recoverable in the substantial reduction in unnecessary visits made to sites by installers.

It is envisaged that all spare line pairs can be terminated with test devices in accordance with the invention such that remote testing of the line condition can be carried out. In any event, the test procedure can be conducted in order to see whether a pair or wires is terminated in a test device. In the absence of the receipt of signals indicating the appropriate differential resistance the line pair may be either faulty or simply not provided with a test device. In either case a further pair of wires may be adopted in preference in order to avoid a site visit without confirmation that a nominated line pair is in working condition.

The device presents working conditions and line identity indications without external electrical connections. The line test system can, therefore, perform its diagnostic testing with little or no need for modification.

It will be appreciated that the test device simulates a fault condition within the fault measuring range of the line test system, and that when the tested line pair is brought into use, either for connection to customer premises or for extending the line pair to a further distribution point, then the test device will be removed to avoid a continuous fault condition on the line pair.

Whereas the present invention has been described with reference to a communications system intended for telephony, it will be appreciated that the present invention is equally applicable to the testing of line pairs of a communications system intended for data communications.

I claim:

1. A method for testing the working condition of a spare line pair of an electrically conductive communications cable which extends from a node to a remote distribution point, from which distribution point the remote end of each working line pair of the cable is to be connected to a customer's premises or to a further distribution point, as appropriate, and a similar future connection is intended for the or each spare line pair of the cable; said method comprising:
   identifying at least one spare line pair of the cable prior to establishing said future connection, and connecting an individual spare line test device between the ends of the or at least one spare line pair at the remote distribution point, the test device having a first signal conditioning characteristic to a signal of one polarity applied to the line and a second signal conditioning characteristic to a signal of the other polarity applied to the line and thereafter leaving the or each test device connected to its associated line pair so long as that line pair remains in its spare status;
   providing at the node an exchange equipment termination for the or said at least one spare line pair;
   subsequently applying test signals of both polarities to a spare line pair via a test access facility associated with the exchange equipment termination for that spare line pair; and
   determining from the relative conditions of the test signals whether the tested spare line pair is in working order.

2. A method as in claim 1, wherein the test signals are applied via a test access facility that is located at the node site.

3. A method as in claim 2, wherein the node is part of a communications exchange.

4. A method as in claim 1, wherein the test signals are applied via a test access facility provided at another node and via conductive wires in an optical fibre communications link interconnecting the two nodes.

5. A method as in claim 1, in which the test signals are DC voltages.

6. A test device for use in the method of claim 1, the device comprising:
   means for connecting the test device between the remote ends of a spare line pair,
   first signal conditioning means which pass signals of the one polarity applied across the connecting means,
   second signal conditioning means which pass signals of the other polarity applied across the connecting means, and
   a housing containing one only of said first signal conditioning means.

7. A device as in claim 6, in which the first and second signal conditioning means are connected in parallel between the connecting means.

8. A device as in claim 6, in which the first and/or second signal conditioning means comprise only passive elements.

9. A device as in claim 8, in which the first and/or second signal conditioning means comprise a resistor in series with a diode.

10. A device as in claim 6, in which said connecting means comprise fly leads.

11. A device as in claim 6, in which the connecting means comprise electrical connectors mounted on the housing.

12. A communications system having a capability for testing the working condition of spare line pairs, the system comprising:
- an electrically conductive communications cable which extends from a node to a remote distribution point and has a plurality of spare line pairs,
- a test access facility associated with exchange equipment terminations,
- means for applying test signals to the test access facility,
- means for determining the relative conditions of the test signals when applied on the tested line pair;
- a plurality of identical test devices connected between the ends of a respective plurality of spare line pairs at the remote distribution point, the other ends of the respective plurality of spare line pairs being terminated at the node in respective exchange equipment terminations
- the means for applying signals being arranged to apply signals of both polarities via the test access facility to a selected one of the spare line pairs connected to its respective test device; and
- the means for determining being arranged to determine from the relative conditions of the test signals whether the line pair under test is in working condition.

13. A system as in claim 12, wherein the test access facility is located at the node site.

14. A system as in claim 13, wherein the node is part of a communications exchange.

15. A system as in claim 12, wherein the test access facility is located at another node and is connected to said node by conductive wires in an optical fibre communications line interconnecting the two nodes.

16. A method for conditioning spare conductive line-pairs in a communication signal distribution system so that a spare line-pair can be subsequently tested from a proximal end distribution site before being removed from its spare status and utilized by connection of its distal end for utilization, said method comprising the steps of:
- connecting a respectively corresponding substantially identical test unit to the distal end of each of a plurality of spare line-pairs in a communication system and leaving said test units so-connected until a designated spare line-pair is to be utilized;
- prior to connection of the distal end of the designated spare line-pair for utilization, applying test signals to the proximal end of the designated line-pair and thereby ascertaining its operational status; and
- if the designated line-pair tests as operational, then disconnecting the test unit from its distal end and re-connecting the distal end of the designated line pair for utilization.

17. A method as in claim 16 wherein the test unit provides a line terminating impedance that represents a predetermined fault condition within the range of fault testing equipment located at a communication systems exchange site.

18. A method as in claim 17 wherein said applying test signals step includes the connection of said fault testing equipment to the proximal end of the designated line-pair.

19. A method as in claim 16 wherein said test unit has a pair of terminals between which there is a first impedance to electrical current flowing in a first direction and a second impedance to electrical current flowing in the opposite second direction.

20. A method as in claim 16 wherein said test signals are applied to the proximal end of said designated line-pair via a node of the communications system located remotely from said proximal end.

* * * * *